United States Patent
Watanabe et al.

(10) Patent No.: US 8,519,773 B2
(45) Date of Patent: Aug. 27, 2013

(54) POWER SWITCH WITH ONE-SHOT DISCHARGE AND INCREASED SWITCHING SPEED

(75) Inventors: Hiroshi Watanabe, Tokyo (JP); Hiroaki Kojima, Tokyo (JP); Kazuya Machida, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 13/163,110

(22) Filed: Jun. 17, 2011

(65) Prior Publication Data

US 2012/0319762 A1 Dec. 20, 2012

(51) Int. Cl.
*H03K 17/687* (2006.01)

(52) U.S. Cl.
USPC .............................. 327/434; 327/534; 333/103

(58) Field of Classification Search
USPC .................... 327/434, 534; 333/103
See application file for complete search history.

(56) References Cited

U.S. PATENT DOCUMENTS

| | | | | |
|---|---|---|---|---|
| 4,473,761 A * | 9/1984 | Peterson | ........................ | 327/382 |
| H310 H * | 7/1987 | Johnson | ........................ | 370/537 |
| 4,716,319 A * | 12/1987 | Rebeschini | ........................ | 327/554 |
| 5,191,244 A * | 3/1993 | Runaldue et al. | ........................ | 326/86 |
| 5,389,833 A * | 2/1995 | Kay | ........................ | 327/96 |
| 5,422,591 A * | 6/1995 | Rastegar et al. | ........................ | 327/409 |
| 5,552,723 A * | 9/1996 | Shigehara et al. | ........................ | 326/86 |
| 6,417,717 B1 * | 7/2002 | Loinaz | ........................ | 327/407 |
| 6,670,790 B2 | 12/2003 | Stellberger | | |
| 7,215,043 B2 * | 5/2007 | Tsai et al. | ........................ | 307/130 |
| 7,576,600 B2 * | 8/2009 | Jiang et al. | ........................ | 327/544 |
| 7,626,360 B2 | 12/2009 | Melanson | | |
| 7,710,076 B2 | 5/2010 | Goto | | |
| 7,724,067 B1 * | 5/2010 | Tu et al. | ........................ | 327/427 |
| 7,733,075 B1 * | 6/2010 | Vasudevan | ........................ | 323/314 |
| 7,746,154 B2 * | 6/2010 | Merandat et al. | ........................ | 327/408 |

FOREIGN PATENT DOCUMENTS

EP 0720270 4/1997

* cited by examiner

*Primary Examiner* — Kenneth B. Wells
(74) *Attorney, Agent, or Firm* — Alan A.R. Cooper; W. James Brady; Frederick J. Telecky, Jr.

(57) ABSTRACT

A method for switching between first and second voltages is provided. Initially, a first voltage is provided from a first input terminal to an output terminal through a first MOS transistor, and the first MOS transistor is deactivated. A back-gate of a second MOS transistor is shorted to the output terminal in response to the deactivation of the first MOS transistor and after a settling interval, and the second MOS transistor is activated while its back-gate is shorted to the terminal so as to provide a second voltage from a second input terminal to the output terminal.

20 Claims, 4 Drawing Sheets

POWER SWITCH WITH ONE-SHOT DISCHARGE AND INCREASED SWITCHING SPEED

TECHNICAL FIELD

The invention relates generally to a power switch and, more particularly, to a power switch with an increased switching speed.

BACKGROUND

Turning to FIG. 1, an example of a conventional power switch 100-1 can be seen. In this example, a NMOS transistor Q1 is employed as the power sourcing or switching element that is coupled between the input and output terminals IN and OUT. NMOS transistor Q1 is generally controlled by charge pump 102. However, in this configuration, the charge pump 102 can consume a significant amount of current, and there is a "turn on" delay associated with the switch 100-1. As an alternative, a storage capacitor C1 (as shown in the power switch 100-2 in FIG. 2) to combat some of the issues with power switch 100-2, but the inclusion of capacitor C1 presents another set of issues (such as the area consumed by capacitor C1). Therefore, there is a need for an improved power switch.

Some other conventional circuits are: U.S. Pat. No. 6,670,790; U.S. Pat. No. 7,626,360; U.S. Pat. No. 7,710,076; and European Patent No. EP0720270.

SUMMARY

An embodiment of the present invention, accordingly, provides an apparatus. The apparatus comprises a charge pump; a state machine having a first mode, a second mode and a third mode; an first MOS transistor that is coupled between an input terminal and an output terminal and that is coupled to the charge pump at its gate, wherein the first MOS transistor is activated during the third mode and deactivated during the first and second modes; a buffer that is coupled to the body of the first MOS transistor and the state machine, wherein the buffer provides a gate bias voltage to the body of the first MOS transistor during the third mode; and a gate bias circuit having: a second MOS transistor that is coupled to the charge pump at its drain and gate; a current source that is coupled to the source of the second MOS transistor; and a feedback circuit that is coupled to the state machine and the source of the second MOS transistor.

In accordance with an embodiment of the present invention, the feedback circuit further comprises: a selector that is coupled to the state machine; and an amplifier that is coupled to the selector, the source of the second MOS transistor, and the charge pump.

In accordance with an embodiment of the present invention, the current source further comprises a bias circuit.

In accordance with an embodiment of the present invention, the feedback circuit further comprises: an input circuit that is coupled to the input terminal and that is coupled between the source of the second MOS transistor and the bias circuit; and an enable circuit that is coupled between the input circuit and the bias circuit and that activates the feedback circuit during the third mode.

In accordance with an embodiment of the present invention, the apparatus further comprises a current mirror that is coupled between the enable circuit and the bias circuit and that is coupled to the charge pump.

In accordance with an embodiment of the present invention, the current mirror further comprises a first current mirror, and wherein input circuit further comprises: a second current mirror that is coupled to the input terminal, the source of the second MOS transistor, and the enable circuit; and a third current mirror that is coupled to the output terminal, the source of the second MOS transistor, and the enable circuit.

In accordance with an embodiment of the present invention, the input circuit further comprises a current mirror that is coupled to the input terminal, the source of the second MOS transistor, and the enable circuit.

In accordance with an embodiment of the present invention, the feedback circuit further comprises a Schmitt trigger that is coupled to the bias circuit and the charge pump.

In accordance with an embodiment of the present invention, the feedback circuit further comprises a discharge circuit that is coupled to the charge pump.

In accordance with an embodiment of the present invention, an apparatus is provided. The apparatus comprises a first input terminal; a second input terminal; an output terminal; a first power switch having: a first charge pump; a first state machine having a first mode, a second mode and a third mode; an first MOS transistor that is coupled between the first input terminal and the output terminal and that is coupled to the first charge pump at its gate, wherein the first MOS transistor is activated during the third mode of the first state machine and deactivated during the first and second modes of the first state machine; a first buffer that is coupled to the body of the first MOS transistor and the first state machine, wherein the first buffer provides a first gate bias voltage to the body of the first MOS transistor during the third mode of the first state machine; and a first gate bias circuit having: a second MOS transistor that is coupled to the first charge pump at its drain and gate; a first current source that is coupled to the source of the second MOS transistor; and a first feedback circuit that is coupled to the first state machine and the source of the second MOS transistor; and a second power switch having: a second charge pump; a second state machine having an first mode, a second mode and a third mode; an third MOS transistor that is coupled between the second input terminal and the output terminal and that is coupled to the second charge pump at its gate, wherein the third MOS transistor is activated during the third mode of the second state machine and deactivated during the first and second modes of the second state machine; a second buffer that is coupled to the body of the first MOS transistor and the second state machine, wherein the second buffer provides a second gate bias voltage to the body of the third MOS transistor during the third mode of the second state machine; and a second gate bias circuit having: a fourth MOS transistor that is coupled to the second charge pump at its drain and gate; a second current source that is coupled to the source of the fourth MOS transistor; and a second feedback circuit that is coupled to the second state machine and the source of the fourth MOS transistor.

In accordance with an embodiment of the present invention, the first and second feedback circuits each further comprise: a selector that is coupled to the state machine; and an amplifier that is coupled to the selector, the source of the second MOS transistor, and the charge pump.

In accordance with an embodiment of the present invention, the first and second current sources further comprise first and second bias circuits, respectively.

In accordance with an embodiment of the present invention, the first feedback circuit further comprises: a first input circuit that is coupled to the first input terminal and that is coupled between the source of the second MOS transistor and the first bias circuit; and a first enable circuit that is coupled between the first input circuit and the first bias circuit and that activates the first feedback circuit during the third mode of the first state machine.

In accordance with an embodiment of the present invention, the feedback circuit further comprises: a second input circuit that is coupled to the second input terminal and that is coupled between the source of the fourth MOS transistor and the second bias circuit; and a second enable circuit that is coupled between the second input circuit and the second bias circuit and that activates the second feedback circuit during the third mode of the second state machine.

In accordance with an embodiment of the present invention, the first power switch further comprises a current mirror that is coupled between the first enable circuit and the first bias circuit and that is coupled to the first charge pump.

In accordance with an embodiment of the present invention, the current mirror further comprises a first current mirror, and wherein first input circuit further comprises: a second current mirror that is coupled to the first input terminal, the source of the second MOS transistor, and the first enable circuit; and a third current mirror that is coupled to the output terminal, the source of the second MOS transistor, and the first enable circuit.

In accordance with an embodiment of the present invention, the second input circuit further comprises a fourth current mirror that is coupled to the second input terminal, the source of the fourth MOS transistor, and the second enable circuit.

In accordance with an embodiment of the present invention, the second feedback circuit further comprises a Schmitt trigger that is coupled to the second bias circuit and the second charge pump.

In accordance with an embodiment of the present invention, the feedback second circuit further comprises a discharge circuit that is coupled to the second charge pump.

In accordance with an embodiment of the present invention, a method is provided. The method comprises providing a first voltage from a first input terminal to an output terminal through a first MOS transistor; deactivating the first MOS transistor; shorting a back-gate of a second MOS transistor to the output terminal in response to the deactivation of the first MOS transistor and after a settling interval; and activating the second MOS transistor while its back-gate is shorted to the terminal so as to provide a second voltage from a second input terminal to the output terminal.

In accordance with an embodiment of the present invention, the step of activating the second MOS transistor further comprises: selecting the lesser of second voltage and the voltage on the output terminal with a current mirror; amplifying the current from the current mirror; and providing the amplified current to the gate of the second MOS transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
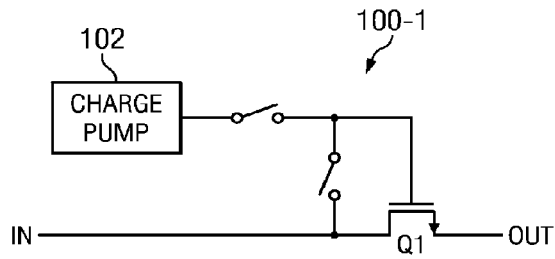
FIGS. 1 and 2 are diagrams of examples of conventional power switches.
Figure 2:
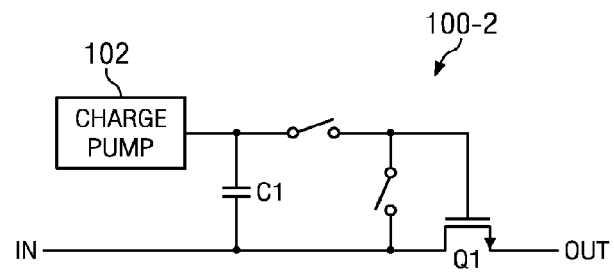

Refer now to the drawings wherein depicted elements are, for the sake of clarity, not necessarily shown to scale and wherein like or similar elements are designated by the same reference numeral through the several views.

Figure 3:
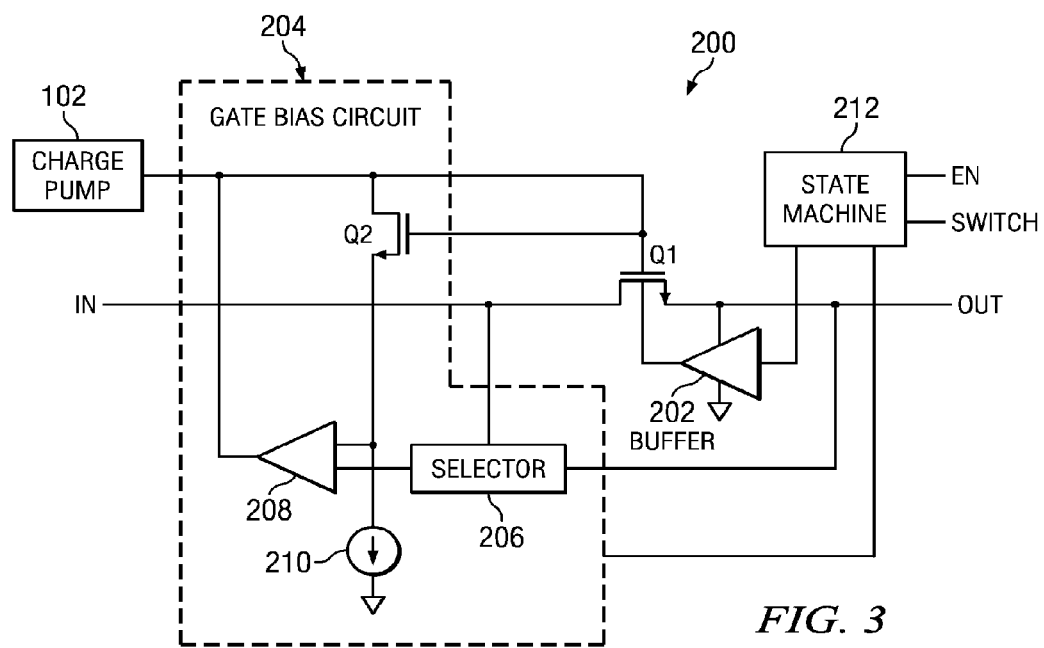
FIG. 3 are diagrams of examples of power switch in accordance with an embodiment of the present invention.

Turning to FIG. 3, an example of a power switch 200 in accordance with an embodiment of the present invention can be seen. Generally, to have improved operation over other conventional power switches (i.e., 100-1), power switch 200 employs a gate bias circuit 204, state machine 212, and buffer 202 to increase the switching speed of transistor Q1 (which is typically an NMOS transistor). In operation, the state machine 212 provides controls to the buffer 202 and gate bias circuit 204 based on an enable signal EN and switch signal SWITCH. Usually, the state machine 212 has three operational modes: an off mode, an on mode, and a standby mode. During the off mode, the gate bias circuit 204 is deactivated and the buffer 202 is controlled so that the body of the transistor Q1 is at ground, and transistor Q1 is "off" or deactivated. When transistor Q1 turns "on" or is activated in the on mode, the state machine 212 deactivated the gate bias circuit 204. During this on mode, the buffer 202 couples the back gate or body of transistor Q1 to the output terminal so that the voltage at the output terminal is provided to the back gate, changing the threshold voltage (i.e., decreasing) for transistor Q1. During the standby mode, the gate bias circuit 204 is activated so that the voltage at the gate of the transistor Q1 is controlled at the predetermined voltage, and the buffer 202 is controlled so that the body of the transistor Q1 is at ground, and the transistor Q1 is "off" or deactivated. Transistor Q2 (which is typically an NMOS transistor) in conjunction with the current source 210 operates as a replica circuit, and the voltage from this replica circuit is differentially amplified by amplifier 208 with the lesser of the voltage on the input and output terminals IN and OUT (which is selected by the selector 206). This amplified signal is then used to bias the gate of transistors Q1 and Q2, allowing the transistor Q1 to activate more quickly. Finally, for standby mode, when the transistor Q1 is switched "off," there is a lag time or setting interval during deactivation (which can, for example, be about 300 ns) to allow for settling.

Figure 4:
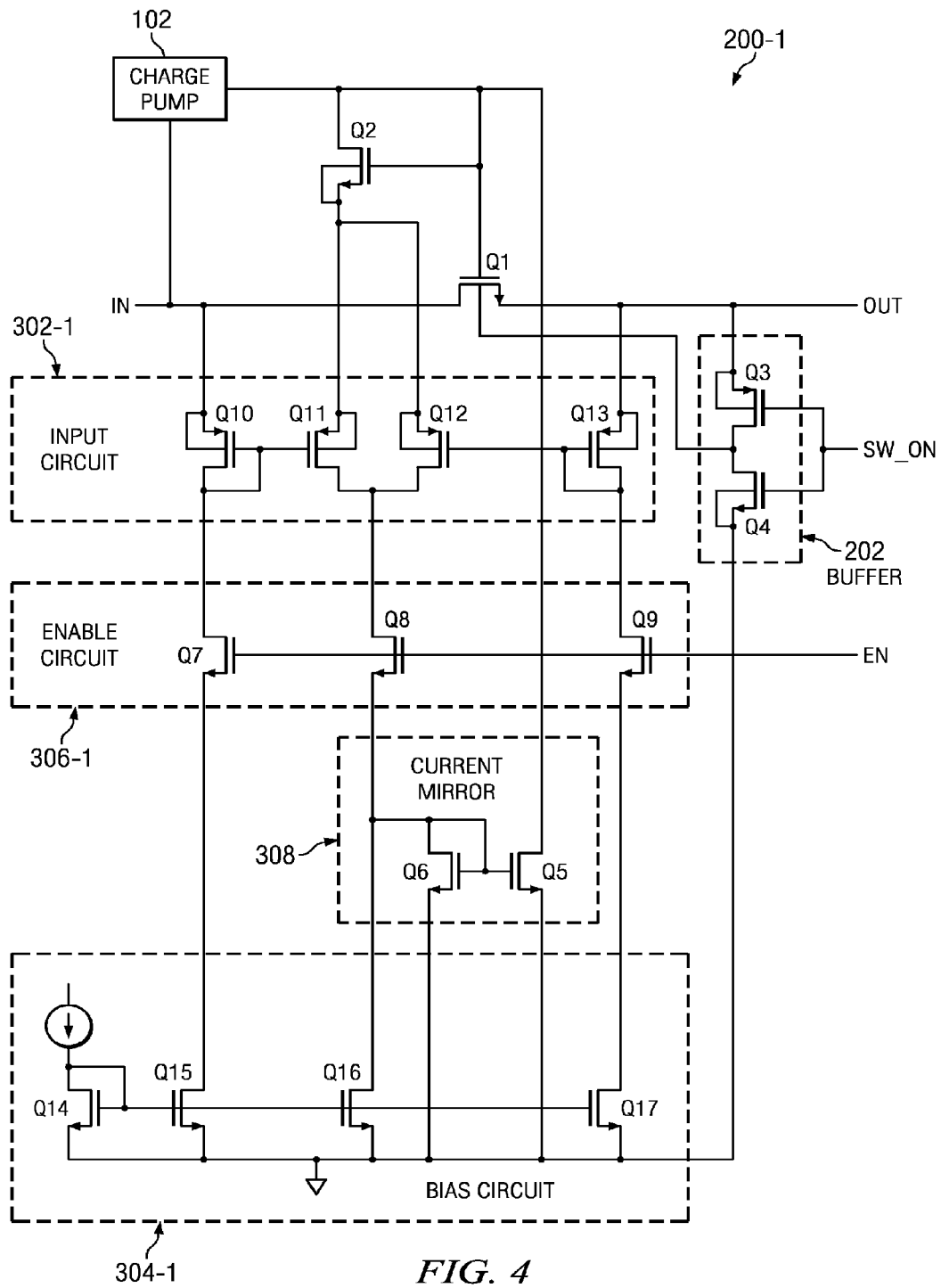
FIGS. 4 and 5 are more detailed diagrams of examples of power switch of FIG. 2.

In FIG. 4, a more detailed example of a power switch 200-1 can be seen. In this example, the gate bias circuit 204 is generally comprised of input circuit 302-1 (which generally includes transistors Q10 to Q13 that can, for example, be PMOS transistors), bias circuit 304-1 (which generally includes transistors Q14 to Q17 that can, for example, be NMOS transistors), an enable circuit 306-1 (which generally includes transistors Q7 through Q9 that can, for example, be NMOS transistors), and current mirror 308 (which generally includes transistors Q5 and Q6 that can, for example, be NMOS transistors). Additionally, the buffer 202 is generally formed of transistors Q3 and Q4 (which can, for example, be PMOS and NMOS transistors, respectively) that can short to the body or back gate of transistor Q1 to ground or terminal OUT. The input circuit 302-1 (which is generally arranged as a pair of common gate amplifiers Q10/Q11 and Q12/Q13 that are active depending on the voltage on the input and output terminals IN and OUT) in conjunction with bias circuit 304-1 and current mirror 308 operate as a common-gate operational transconductance amplifier that performs substantially the same function as the selector 206 and amplifier 208 of FIG. 3. In the off mode or the on mode, the enable circuit 306-1 is deactivated by the control signal applied to the gates of the transistors Q7, Q8, and Q9. That is, the transistors Q7, Q8, Q9 turn off, and the gate bias circuit 204 is deactivated. In the standby mode, the enable circuit 306-1 is activated by the control signal applied to the gates of the transistors Q7, Q8, and Q9. That is, the transistors Q7, Q8, and Q9 turn on. The current is provided to the input circuit 302-1 from the bias circuit 304-1 through the enable circuit 306-1, and, the charge pump 102 is activated during the standby mode and the on mode, and it is deactivated during the off mode.

During the standby mode, the charge pump 102 and the gate bias circuit 204 are activated and the voltage at the gates of the transistors Q1 and Q2 is controlled at the predetermined voltage by the charge pump 102 and the gate bias circuit 204. The input circuit 302-1 compares the voltage of the input terminal IN with the voltage of the output terminal OUT, and when the voltage of the input terminal IN is lower than that of the output terminal OUT, the transistors Q10 and Q11 are activated, while the transistors Q12, Q23 are deactivated. When the voltage of the input terminal IN is higher than that of the output terminal OUT, on the other hand, the transistors Q10 and Q11 are deactivated, while the transistors Q12, Q13 are activated. The pair of transistors Q10 and Q11 or transistors Q12 and Q13 amplifies the voltage difference of the sources of these transistors Q1 and Q2, and the current corresponding to this voltage difference is supplied to the charge pump 102 (drain and gate of the transistor Q2 and gate of the transistor Q1) through the current mirror 308 (namely, transistor Q5). Thus, the voltage at the gate of the transistors Q1 and Q2 is maintained at the predetermined voltage by the feedback control of the gate bias circuit 204. The buffer 202 couples the body or the back gate of the transistor Q1 to the ground so that the threshold voltage of the transistor Q1 increases. That is, the threshold voltage of the transistor Q1 rises by the back gate effect (body effect). The predetermined voltage maintained by the gate bias circuit 204 is set higher than the threshold voltage of the transistor Q2 and lower than that of the transistor Q1. During the standby mode, therefore, the transistor Q2 is in on state, while the transistor Q1 is in off state.

When the mode of the power switch 200-1 is changed from the standby mode to the on mode, the gate bias circuit 204 is deactivated, and the buffer 200 couples the body or the back gate of the transistor Q1 to the output terminal OUT so that the output terminal OUT is provided to the back gate, changing the threshold voltage (i.e., decreasing) for the transistor Q1. In this on mode, the body of the back gate of the transistor Q1 and Q2 is coupled to its source, and the threshold voltage of the transistors Q1 and Q2 are the same. Since the voltage at the gate of the transistor Q1 and Q2 is maintained higher than the threshold voltage of the transistor Q2 by the gate bias circuit 204, the transistor Q1 turns "on" quickly because of the body or the back gate connection change from the ground terminal to the output terminal OUT. Due to this mode change from the standby mode to the on mode, the gate bias circuit 204 is deactivated. So, the voltage at the gate of the transistor Q1 and Q2 is raised by the charge pump 102, and this gate voltage is maintained higher than the predetermined voltage.

When the mode of the power switch 200-1 is changed from the on mode to the standby mode, the gate bias circuit 204 is activated, and the buffer 200 couples the body or the back gate of the transistor Q1 to the ground so that the threshold voltage of the transistor Q1 increases. Since the gate bias circuit discharges the gate of the transistors Q1 and Q2 and the threshold voltage of the transistor Q1 rises by the body effect (the back gate effect), the transistor Q1 turns "off." Additionally, the voltage at the gate of the transistor Q1, Q2 is maintained at the predetermined voltage by the gate bias circuit 204.

Figure 5:
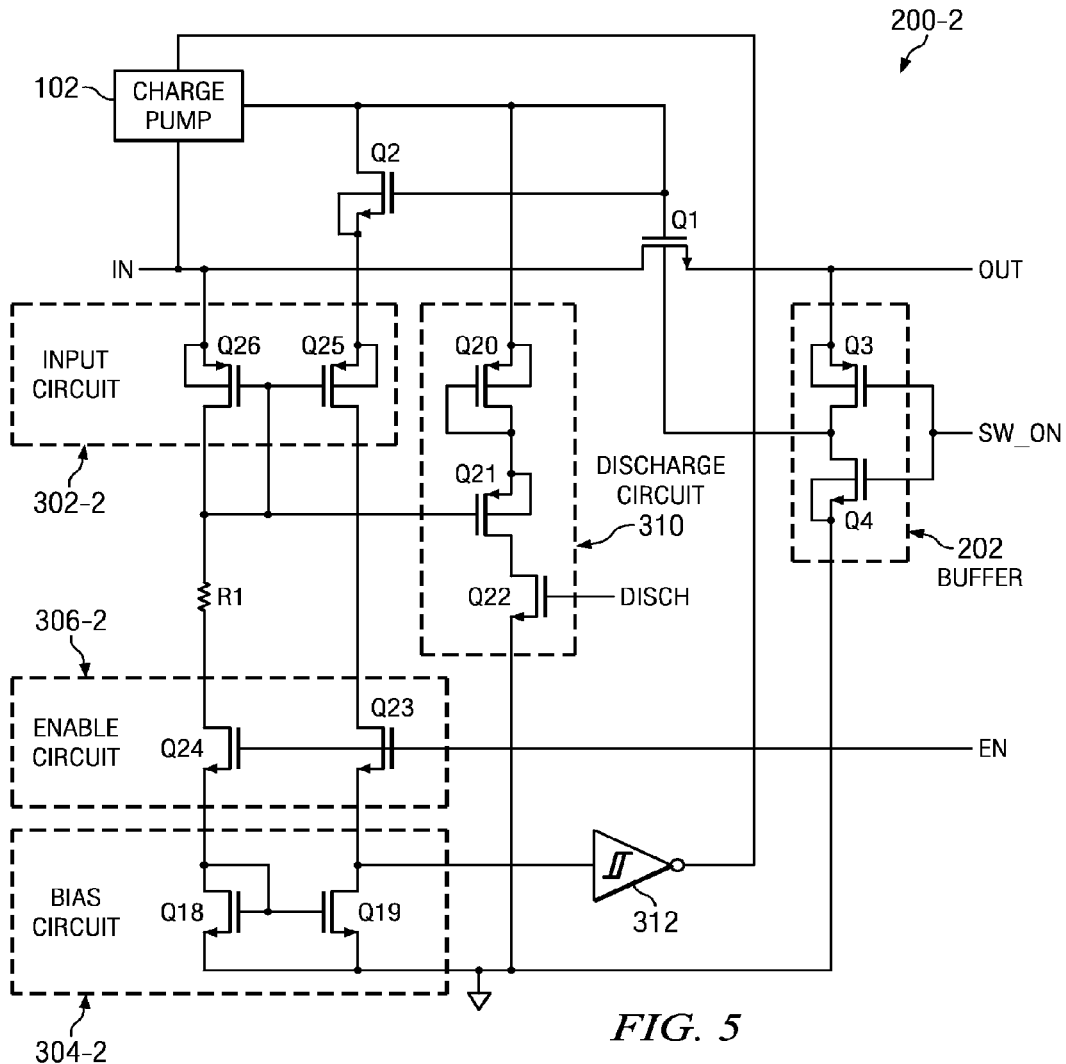

Turning to FIG. 5, another detailed example of a power switch 200-2 can be seen. In this example, the gate bias circuit 204 is generally comprised of input circuit 302-2 (which generally includes transistors Q25 and Q26 that can, for example, be PMOS transistors), bias circuit 304-4 (which generally includes transistors Q18 and Q19 that can, for example, be NMOS transistors), Schmitt trigger 312, an enable circuit 306-2 (which generally includes transistors Q23 and Q24 that can, for example, be NMOS transistors), and a discharge circuit 310 (which generally includes transistors Q20 to Q22 that can, for example, be NMOS and PMOS transistors). The input circuit 302-2 (which is generally arranged as common gate amplifiers) in conjunction with bias circuit 304-2 and Schmitt trigger 312 operate as a common-gate hysteresis comparator that performs substantially the same function of the selector 206 and amplifier 208 of FIG. 3, where the Schmitt trigger deactivates the charge pump 102 when the gate voltage of transistor Q1 is greater than the sum of the gate-source voltage of transistor Q2 and the voltage on input terminal IN. Additionally, the discharge circuit 310 can be used to discharge the gate of transistor Q1 when the transistor Q1 is being switched "off"; this is usually controlled by a discharge signal DISCH from the state machine 212.

During the standby mode, the buffer 202 couples the body or the back gate of the transistor Q1 to the ground terminal or supply rail, and the gate bias circuit is activated. The input circuit 302-2 compares the voltage of the input terminal IN with the source voltage of the transistor Q2 (i.e., $V_{gQ1} - V_{gsQ2}$), and the operation of the charge pump 102 is controlled by this comparison result. When the input voltage at the input terminal IN is lower than the source voltage (i.e., $V_{gQ1} - V_{gsQ2}$) of the transistor Q2, the charge pump 102 is deactivated by an output signal of the Schmitt trigger 312. When the input voltage at the input terminal IN is higher than the source voltage (i.e., $V_{gQ1} - V_{gsQ2}$) of the transistor Q2, the charge pump 102 is activated by the output signal of the Schmitt trigger 312. Since the Schmitt trigger 312 has hysteresis characteristics, the gate voltage of the transistor Q1 (and transistor Q2) varies in a certain voltage range corresponding to the hysteresis of the Schmitt trigger 312. While the charge pump 102 is activated, the gate voltage of the transistor Q1 rises in accordance with the current supplied from the charge pump 102. While the charge pump 102 is deactivated, on the other hand, the gate voltage of the transistor Q1 falls in accordance with the current flowing at the transistor Q2. Since the body or the back gate of the transistor Q1 is coupled to the ground during the standby mode, the threshold voltage of the transistor Q1 becomes at the level higher than the aforementioned certain voltage range. Therefore, the transistor Q1 is in off state during the standby mode, but the transistor Q2 is in on state. And, the discharge circuit 310 is deactivated during the standby mode.

When the mode of the power switch 200-2 is changed from the standby mode to the on mode, the buffer 202 couples the body or the back gate of the transistor Q1 to the output terminal OUT, and the gate bias circuit 204 is deactivated by the deactivation of the enable circuit 306-2. Since the body or the back gate connection of the transistor Q1 is changed from the ground to the output terminal OUT, the threshold voltage of the transistor Q1 decreases lower than the aforementioned certain voltage range and the transistor Q1 turns "on" quickly. Additionally, the gate of the transistor Q1 and Q2 is charged by the charge pump 102, and the voltage of the gate of the transistor Q1 and Q2 is maintained at a certain voltage higher than the aforementioned certain voltage.

When the mode of the power switch 200-2 is changed from the on mode to the standby mode, the buffer 202 couples the body or the back gate of the transistor Q1 to the ground so that the threshold voltage of the transistor Q1 increases, and the gate bias circuit 204 and the discharge circuit 310 are activated so that the voltage of the gate of the transistor Q1, and Q2 falls. Since the gate of the transistor Q1, and Q2 is discharged by the transistor Q2 and the discharge circuit 310, the voltage at the gate of the transistor Q1, and Q2 falls and this gate voltage is maintained at the aforementioned certain voltage range by the control of the gate bias circuit. The discharge circuit 310 is activated by the one-shot discharge signal DISCH, and it discharges from the gate of the transistor Q1, and Q2 during the width of the one-shot discharge signal DISCH, for example 300 ns. The transistor Q1 turns "off" quickly by the discharge operation of the discharge circuit 310.

Figure 6:
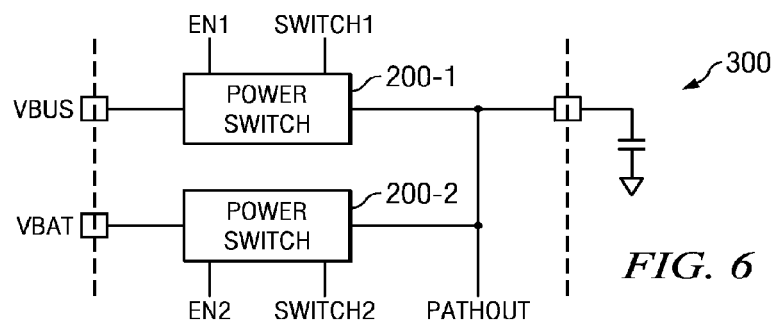
FIG. 6 is a diagram of an example of a system employing the switches of FIGS. 3-5.
Figure 7:
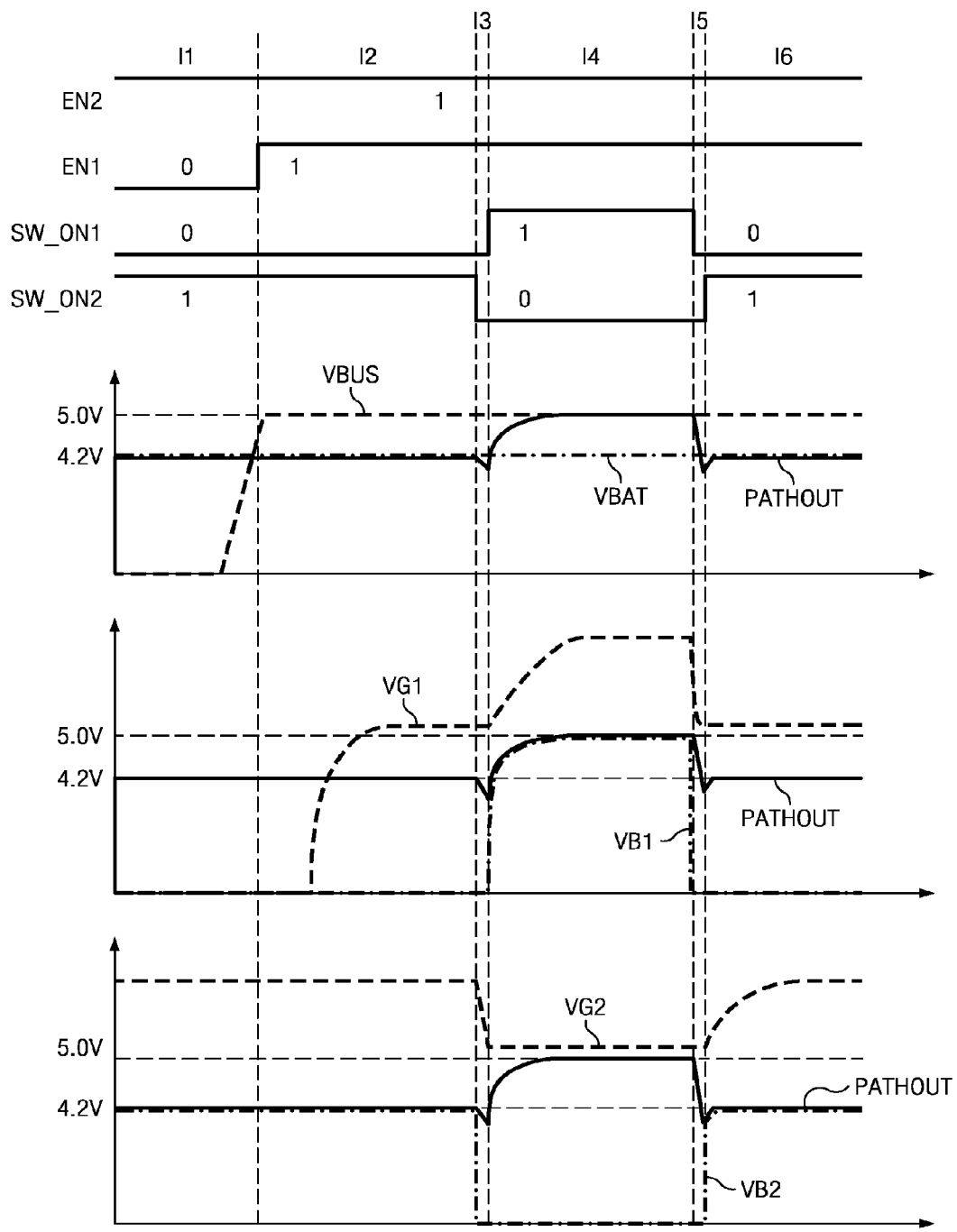
FIG. 7 is a diagram depicting the operation of the system of FIG. 6.

Now turning to FIGS. 6 and 7, a system 300 that employs power switches 200-1 and 200-2 can be seen. In this system 300, power switches 200-1 and 200-2 are coupled to a common output terminal PATHOUT so that each of power switches 200-1 and 200-2 can provide power from its respective input terminal VBUS and VBAT. As shown in FIG. 7, there is a generally constant voltage of about (for example) 4.2V on terminal VBAT, while the voltage on terminal VBUS varies from about (for example) 0V to 5V. An external power supply (not shown in FIG. 6) can also be coupled to the terminal VBUS to provide the supply voltage to the terminal VBUS. During interval I1, switch 200-2 is enabled because signal EN2 is logic high or "1," while switch 200-1 is disabled because signal EN1 is logic low or "0," which allows power to be transmitted from terminal VBAT to terminal PATHOUT. At the beginning of interval I2, the voltage on terminal VBUS changes from 0V to 5V, and switch 200-1 is enabled. During interval I3 (which is a settling interval), signal SW_ON2 causes switch 200-2 to transition from its on mode to its standby mode, while switch 200-1 remains in its standby mode, allowing the back gate voltage VB2 for switch 200-2 to drop to 0V. During the standby mode of switch 200-2, the voltage on terminal PATHOUT drops (where the magnitude is dependant on the load on terminal PATHOUT), and, at the end of interval I3, signal SW_ON1 causes switch 200-1 to enter its on mode from the standby mode. As a result of being activated in interval I4, the back gate voltage VB1 of switch 200-1 increases so as to be substantially equal to voltage on terminal PATHOUT. Additionally, during interval I4, the gate voltage VG1 for switch 200-1 is biased, while the gate voltage VG2 for switch 200-2 drops. This allows the voltage on terminal PATHOUT to plateau at about 5V, and, at the beginning of interval I5 (when signal SW_ON1 transitions to logic low or "0"), the voltage on terminal PATHOUT drops (similar to interval I3). Then, at the beginning of interval I6, signal SW_ON2 transitions to logic high or "1," allowing the voltage on terminal PATHOUT to return to 4.2V.

As an example, a Universal Serial Bus (The USB) cable can be coupled to the terminal VBUS and the external power supply voltage (i.e., 5V). Additionally, for this example, the battery is can be coupled to the terminal VBAT. When the battery is connected to the terminal VBAT and the USB cable is coupled to the terminal VBUS, the power switch 200-1 is in on mode and the power switch 200-2 is in standby mode. The external voltage (5V) is supplied to the terminal PATHOUT through the power switch 200-1. If the USB cable is disconnected from the terminal VBUS, the battery voltage can be supplied to the terminal PATHOUT instead of the external voltage in order to prevent the voltage drop at the terminal PATHOUT. Therefore, it is necessary desirable to have that the power switch 200-1 turns off quickly and the power switch 200-2 turns on quickly.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a charge pump;
    a state machine having a first mode, a second mode and a third mode;
    a first MOS transistor that is coupled between an input terminal and an output terminal and that is coupled to the charge pump at its gate, wherein the first MOS transistor is activated during the third mode and deactivated during the first and second modes;
    a buffer that is coupled to the body of the first MOS transistor and the state machine, wherein the buffer provides a gate bias voltage to the body of the first MOS transistor during the third mode; and
    a gate bias circuit having:
        a second MOS transistor that is coupled to the charge pump at its drain and gate;
        a current source that is coupled to the source of the second MOS transistor; and
    a feedback circuit that is coupled to the state machine and the source of the second MOS transistor.

2. The apparatus of claim 1, wherein the feedback circuit comprises:
    an amplifier that is coupled to the selector, the source of the second MOS transistor, and the charge pump.

3. The apparatus of claim 1, wherein the current source comprises a bias circuit.

4. The apparatus of claim 3, wherein the feedback circuit comprises:
    an input circuit that is coupled to the input terminal and that is coupled between the source of the second MOS transistor and the bias circuit; and
    an enable circuit that is coupled between the input circuit and the bias circuit and that activates the feedback circuit during the third mode.

5. The apparatus of claim 4, wherein the apparatus further comprises a current mirror that is coupled between the enable circuit and the bias circuit and that is coupled to the charge pump.

6. The apparatus of claim 5, wherein the current mirror comprises a first current mirror, and wherein input circuit further comprises:
- a second current mirror that is coupled to the input terminal, the source of the second MOS transistor, and the enable circuit; and
- a third current mirror that is coupled to the output terminal, the source of the second MOS transistor, and the enable circuit.

7. The apparatus of claim 4, wherein the input circuit comprises a current mirror that is coupled to the input terminal, the source of the second MOS transistor, and the enable circuit.

8. The apparatus of claim 7, wherein the feedback circuit further comprises a Schmitt trigger that is coupled to the bias circuit and the charge pump.

9. The apparatus of claim 8, wherein the feedback circuit further comprises a discharge circuit that is coupled to the charge pump.

10. An apparatus comprising:
- a first input terminal;
- a second input terminal;
- an output terminal;
- a first power switch having:
  - a first charge pump;
  - a first state machine having a first mode, a second mode and a third mode;
- a first MOS transistor that is coupled between the first input terminal and the output terminal and that is coupled to the first charge pump at its gate, wherein the first MOS transistor is activated during the third mode of the first state machine and deactivated during the first and second modes of the first state machine;
- a first buffer that is coupled to the body of the first MOS transistor and the first state machine, wherein the first buffer provides a first gate bias voltage to the body of the first MOS transistor during the third mode of the first state machine; and
- a first gate bias circuit having:
- a second MOS transistor that is coupled to the first charge pump at its drain and gate;
- a first current source that is coupled to the source of the second MOS transistor; and
- a first feedback circuit that is coupled to the first state machine and the source of the second MOS transistor; and
- a second power switch having:
  - a second charge pump;
  - a second state machine having an first mode, a second mode and a third mode;
- a third MOS transistor that is coupled between the second input terminal and the output terminal and that is coupled to the second charge pump at its gate, wherein the third MOS transistor is activated during the third mode of the second state machine and deactivated during the first and second modes of the second state machine;
- a second buffer that is coupled to the body of the first MOS transistor and the second state machine, wherein the second buffer provides a second gate bias voltage to the body of the third MOS transistor during the third mode of the second state machine; and
- a second gate bias circuit having:
- a fourth MOS transistor that is coupled to the second charge pump;
- a second current source that is coupled to the source of the fourth MOS transistor; and
- a second feedback circuit that is coupled to the second state machine and the source of the fourth MOS transistor.

11. The apparatus of claim 10, wherein the first and second feedback circuits each comprise:
- an amplifier that is coupled to the selector, the source of the second and fourth MOS transistors, and the charge pump.

12. The apparatus of claim 10, wherein the first and second current sources comprise first and second bias circuits, respectively.

13. The apparatus of claim 12, wherein the first feedback circuit comprises:
- a first input circuit that is coupled to the first input terminal and that is coupled between the source of the second MOS transistor and the first bias circuit; and
- a first enable circuit that is coupled between the first input circuit and the first bias circuit and that activates the first feedback circuit during the third mode of the first state machine.

14. The apparatus of claim 13, wherein the second feedback circuit comprises:
- a second input circuit that is coupled to the second input terminal and that is coupled between the source of the fourth MOS transistor and the second bias circuit; and
- a second enable circuit that is coupled between the second input circuit and the second bias circuit and that activates the second feedback circuit during the third mode of the second state machine.

15. The apparatus of claim 14, wherein the first power switch further comprises a current mirror that is coupled between the first enable circuit and the first bias circuit and that is coupled to the first charge pump.

16. The apparatus of claim 15, wherein the current mirror comprises a first current mirror, and wherein first input circuit further comprises:
- a second current mirror that is coupled to the first input terminal, the source of the second MOS transistor, and the first enable circuit; and
- a third current mirror that is coupled to the output terminal, the source of the second MOS transistor, and the first enable circuit.

17. The apparatus of claim 16, wherein the second input circuit comprise a fourth current mirror that is coupled to the second input terminal, the source of the fourth MOS transistor, and the second enable circuit.

18. The apparatus of claim 17, wherein the second feedback circuit comprises a Schmitt trigger that is coupled to the second bias circuit and the second charge pump.

19. The apparatus of claim 18, wherein the second feedback second circuit further comprises a discharge circuit that is coupled to the second charge pump.

20. A method comprising:
- providing a first voltage from a first input terminal to an output terminal through a first MOS transistor;
- deactivating the first MOS transistor;
- shorting a back-gate of a second MOS transistor to the output terminal in response to the deactivation of the first MOS transistor and after a settling interval; and
- activating the second MOS transistor while its back-gate is shorted to the output terminal so as to provide a second voltage from a second input terminal to the output terminal wherein the step of activating the second MOS transistor comprises:
- selecting the lesser of the second voltage and the voltage on the output terminal with a current mirror;
- amplifying the current from a current mirror; and providing the amplified current to the gate of the second MOS transistor.

\* \* \* \* \*